Figure 1:
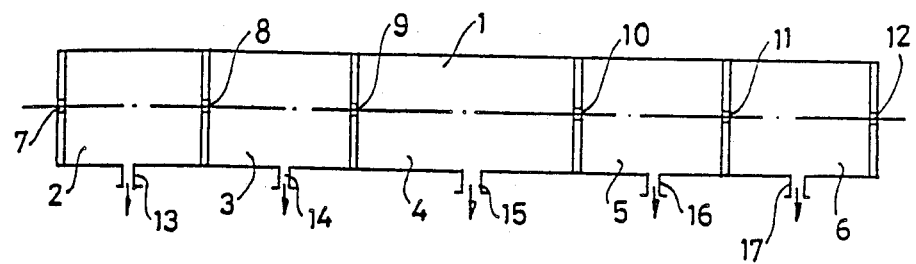

United States Patent [19]

Lievens et al.

[11] Patent Number: 4,790,165
[45] Date of Patent: Dec. 13, 1988

[54] FEED-THROUGH ELEMENT FOR A VACUUM APPARATUS

[75] Inventors: Hugo Lievens, Gent; Wilfried Coppens, Kortrijk-Marke, both of Netherlands

[73] Assignee: N.V. Bekaert S.A., Zwevegem, Belgium

[21] Appl. No.: 106,366

[22] Filed: Oct. 9, 1987

[30] Foreign Application Priority Data

Oct. 23, 1986 [NL] Netherlands .......................... 8602659

[51] Int. Cl.⁴ .......................... B21C 3/02; B21D 37/16; C21D 1/74; C23C 14/56
[52] U.S. Cl. .......................... 72/38; 72/274; 72/467
[58] Field of Search ............... 34/242; 72/38, 41, 274, 72/467, 468; 118/50; 432/242

[56] References Cited

U.S. PATENT DOCUMENTS

| 1,896,674 | 2/1933 | Longwell | 72/41 |
| 3,417,589 | 12/1968 | Bobrowsky | 72/60 |
| 3,952,568 | 4/1976 | Wareing et al. | 72/38 |
| 4,054,044 | 10/1977 | Wareing et al. | 72/38 |

FOREIGN PATENT DOCUMENTS 2315645  1/1977  France .
1428993  3/1976  United Kingdom .

Primary Examiner—E. Michael Combs
Attorney, Agent, or Firm—Foley & Lardner, Schwartz, Jeffery, Schwaab, Mack, Blumenthal & Evans

[57] ABSTRACT

The invention relates to a feed-through element for application in a vacuum apparatus for the continuous feeding through of wire-shaped material to be treated at least made up of a casing and a sealing element set up therein that is in contact with the surface of the wire-shaped material during feeding through, whereby the sealing element is formed by a drawing die (20) and where y the casing is formed by a holder (21; 22) for the drawing die (20), at least a part of the holder (21; 22) being connected in a gastight way to a partition wall of the vacuum apparatus (1) and whereby the drawing die (20) and the holder (21; 22) act together in sealing relation.

5 Claims, 1 Drawing Sheet

U.S. Patent    Dec. 13, 1988    4,790,165

FEED-THROUGH ELEMENT FOR A VACUUM APPARATUS

The invention relates to a feed-through element for application in a vacuum apparatus for the continuous feeding through of wire-shaped material to be treated at least made up of a casing and a sealing element set up therein that is in contact with the surface of the wire-shaped material during feeding through.

Such feed-through element is known from British patent specification No. 1,428,933. In said publication is described a tubular feed-through element which can be inserted in the external wall of a vacuum-treatment apparatus or in the partition walls located between the different compartments of such apparatus. Said tubular feed-through elements consist of a casing and also of bored end flanges through which the wire-shaped material to be treated can be fed. Inside the casing there are bored sealing elements of material with a low friction coefficient and/or a good heat resistance, the bore being such that the outer surface of the wire-shaped material to be treated fits closely to the inner surface of the bore.

Such a known feed-through element has the disadvantage that the elements which fit closely to the wire-shaped material thereby forming a seal are subject to very high wear, the presence of such elements entailing a high degree of mechanical friction as a consequence of which the efforts necessary to feed the wire through may be very high. In addition, the wear mentioned hereinbefore occasions extra contamination of the wire surface, which may cause problems in later stages of the treatment and/or the use.

The treatment of material in a vacuum apparatus is in the present application to be understood as referring to the application of covering layers to the material by means of vacuum deposition or sputtering; the carrying out of cleaning processes by means of vacuum; the carrying out of heat treatments; ion implantations, etc.

Surprisingly, it has been found that the above disadvantages attaching to the feed-through elements known in the prior art can be solved by the feed-through element according to the invention which is characterized in that the sealing element is formed by a drawing die and in that the casing is formed by a holder for the drawing die, at least a part of the holder being connected in a gastight way to a partition wall of the vacuum apparatus and the drawing die and the holder acting together in sealing relation.

By a drawing die as mentioned hereinabove is understood a means, known in the wire-products manufacturing industry, having the shape of a bored element generally made of hardened special steel or ceramic material. Such a die is used to reduce the diameter of metal wire under elongation by drawing. It has been found that a drawing die which is common in the wire manufacturing industry makes an excellent sealing element in a vacuum apparatus of the feed-through type. As is well-known, the drawing die has a feed-through aperture with a diameter that is smaller than the outside diameter of the wire to be fed through so that excellent sealing is obtained. If such a drawing die is inserted in a holder at least a part of which is inserted in a gastight way in a partition wall, the drawing die itself and the holder furthermore acting together in sealing relation, an extremely well functioning feed-through element will be obtained.

In particular, the feed-through element according to the invention is provided with a drawing die which causes a reduction not exceeding 2%.

By reduction is in this case understood the quotient $$\frac{\text{orig. } d^2 - \text{final } d^2}{\text{orig. } d^2} \times 100$$

As regards the desired sealing action of the drawing die applied, it has been found that a reduction not exceeding 2% generally suffices; in practice, a reduction of approximately 1% is also highly satisfactory.

Surprisingly, when applying the feed-through elements according to the invention it was found that the utilization of such drawing dies as feed-through element offers considerable advantages as to the quality of certain treated products. In the case in which by means of a vacuum method a metal layer such as aluminum is applied, for instance, the layer applied is present on the wire material in the form of a crystalline aluminum layer containing a great many pores.

It has been found that if a feed-through element in the form of a drawing die is inserted at the end of the vacuum apparatus, there where the wire material leaves the apparatus. This drawing die will give evidence of a densifying action on the freshly deposited aluminum metal. The pores present are shut as it were by the drawing die, which will cause the final wire material to present a higher resistance to corrosion during use. In particular, sealing material is inserted between the drawing die and the holder in the feed-through element according to the invention. A suitable form of sealing material is an O-ring, for instance. Advantageously, the holder of the drawing die of the feed-through element according to the invention can be inserted in a partition wall of a vacuum apparatus so that it can be detached. This way, it can be arranged that when changing from one wire type to another wire type, the change being small, it is possible to simply place another drawing die inside the holder. The detachability of the holder also allows a complete holder exchange in the case of great changes requiring a drawing die of another size.

The invention is also embodied in an apparatus for the treatment in vacuum of wire-shaped material, the material to be treated being continuously fed through the apparatus and the apparatus at least consisting of one or more chambers, means for feeding the material through, means for generating a vacuum and feed-through elements characterized in that at least part of the feed-through elements is formed by the feed-through element according to the invention.

In general, at least the feed-through element at the entry of the apparatus and at the exit of the apparatus will be formed by a feed-through element according to the invention. The feed-through elements in the partition walls between any chambers can also be formed by the feed-through element according to the invention; this is not necessary, however. The demands made upon the feed-through elements between the different chambers as to sealing action are less high because in this case there is a far smaller difference in pressure.

Finally, the invention relates to wire material provided with a metal covering layer which has been applied by means of a vacuum process. According to the invention, this wire material is characterized in that the vacuum process is carried out in the apparatus wherein at least part of the feed-through elements is formed by the feed-through element according to the invention and wherein particularly the feed-through element at the end of the apparatus, where the wire-shaped material leaves the apparatus, is formed by a feed-through element according to the invention. As indicated hereinbefore, such a feed-through element has a special effect in the case in which a metal layer is applied to wire-shaped material by means of a vacuum treatment. The presence of a feed-through element wherein at least a drawing die is inserted causes the pores present in the metal layer to be closed thus having a very positive effect on the corrosion resistance of the material.

The invention will hereinafter be illustrated with reference to the drawing, wherein FIG. 1 shows a schematic section through an apparatus for carrying out a vacuum treatment and wherein one or more feed-through elements according to the invention have been inserted.

Figure 2:
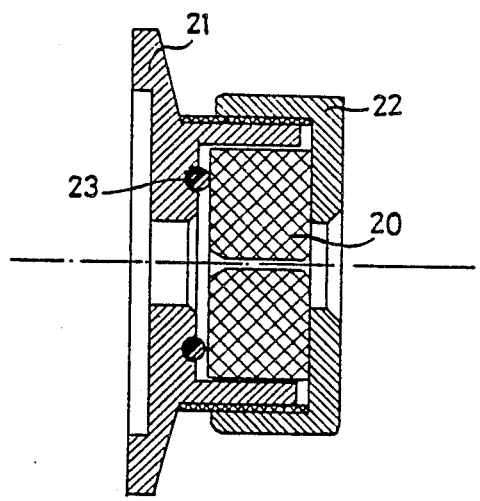

FIG. 2 shows a longitudinal section through a feed-through element according to the invention.

In FIG. 1, a vacuum-treatment apparatus for wire-shaped material is indicated with general reference number 1. In this case, the apparatus consists of several chambers 2, 3, 4, 5 and 6. Feed-through elements 7 and 12 have been inserted at the beginning and end of the apparatus whilst there are also feed-through elements 8 up to and including 11 between different chambers.

Each one of the chambers is connected to a vacuum source via an exit 13, 14, 15, 16 and 17. Generally, a so-called rough vacuum will be provided for instance in chambers 2 and 6 via connections 13 and 17, which is obtained by a pump with a very high pumping capacity creating a relatively low vacuum. The chambers 3 up to and including 5 are connected via their respective exits 14 up to and including 16 to vacuum sources that can create a high vacuum. In the apparatus herein described, at least the feed-through elements 7 and 12 will be formed by a feed-through element according to the invention; the feed-through elements indicated with 8, 9, 10 and 11 may be formed by other feed-through elements although the feed-through elements according to the invention can be utilized.

FIG. 2 shows a drawing on an enlarged scale of a feed-through element according to the invention. The core of the feed-through element is the drawing die 20 that is inserted in a holder composed of 2 parts 21 and 22. The drawing die is retained between the holder parts 21 and 22 and is connected in a sealing way to the holder by means of O-ring 23. Either part 21 or part 22 of the holder can be connected in a gastight way to a partition wall of the apparatus. As indicated hereinbefore, this gastight connection is advantageously detachable so that it is possible not only to replace or to exchange the drawing die in the same holder but also to replace the complete holder by a holder which allows to fit a drawing die of another size.

We claim:

1. In a vacuum apparatus for wire-shape material having at least one vacuum chamber defined by end walls, adapted to receive wire-shaped material passing through said chamber so that the material may be treated under vacuum conditions; the improvement comprising a feed-through element disposed in an end wall, said feed-through element comprising a drawing die means for reducing the cross-sectional area of said wire-shaped material as the material is passed therethrough, holding means for retaining said drawing die, means for providing a gas-tight seal between said holding means and said drawing die, and means for providing a gas-tight seal between said holding means and said end wall, at least one of said aforementioned means for providing a gas-tight seal being detachable whereby said drawing die may be replaced to accommodate wire-shaped material of different size.

2. In a vacuum apparatus according to claim 1, the improvement comprising a feed-through element as set forth disposed in each of an entry and an exit end wall.

3. In a vacuum apparatus according to claim 1, the improvement comprising a plurality of said chambers connected to each other wherein a feed-through element is disposed in at least an entry end wall of a first chamber and in an exit end wall of a last chamber.

4. In a vacuum apparatus according to claim 3, the improvement comprising a feed-through element disposed between connecting chambers.

5. In a vacuum apparatus according to claim 1, the improvement further comprising a feed-through element wherein said drawing die is shaped to reduce the cross-sectional area of the wire-shaped material by an amount not exceeding 2%.

* * * * *

UNITED STATES PATENT AND TRADEMARK OFFICE
CERTIFICATE OF CORRECTION

PATENT NO. : 4,790,165
DATED : December 13, 1988
INVENTOR(S) : Hugo LIEVENS et al It is certified that error appears in the above-identified patent and that said Letters Patent is hereby corrected as shown below:

IN THE ABSTRACT

Line 8, "where y" should be --whereby--.

Signed and Sealed this

Thirty-first Day of October, 1989

Attest:

DONALD J. QUIGG

Attesting Officer     Commissioner of Patents and Trademarks